(12) United States Patent
Kim et al.

(10) Patent No.: US 9,536,600 B2
(45) Date of Patent: Jan. 3, 2017

(54) SIMULTANEOUS MULTI-PAGE COMMANDS FOR NON-VOLATILE MEMORIES

(71) Applicant: International Business Machines Corporation, Armonk, NY (US)

(72) Inventors: Dongki Kim, Austin, TX (US); Jente B. Kuang, Austin, TX (US); Janani Mukundan, Ithaca, NY (US); Gi-Joon Nam, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/520,403

(22) Filed: Oct. 22, 2014

(65) Prior Publication Data

US 2016/0118110 A1   Apr. 28, 2016

(51) Int. Cl.
*G11C 11/56* (2006.01)
*G11C 16/08* (2006.01)

(52) U.S. Cl.
CPC ........ *G11C 11/5628* (2013.01); *G11C 11/5642* (2013.01); *G11C 16/08* (2013.01)

(58) Field of Classification Search
CPC ... G11C 11/5628; G11C 16/08; G11C 11/5642
See application file for complete search history.

(56) References Cited

U.S. PATENT DOCUMENTS

| 7,596,021 | B2 | 9/2009 | Choi et al. |
| 8,266,503 | B2 | 9/2012 | Wood et al. |
| 8,520,442 | B2 | 8/2013 | Yoon |
| 8,539,144 | B2 | 9/2013 | Chae et al. |
| 8,724,381 | B2 | 5/2014 | Burger, Jr. et al. |
| 2010/0097842 | A1* | 4/2010 | Hwang ............. G11C 11/56 365/148 |
| 2011/0158001 | A1 | 6/2011 | Joo |
| 2014/0047163 | A1 | 2/2014 | Kwak |
| 2014/0153329 | A1 | 6/2014 | Kang et al. |
| 2015/0301941 | A1* | 10/2015 | Jun ................. G11C 16/10 711/103 |

OTHER PUBLICATIONS

"NAND Flash 101: An Introduction to NAND Flash and How to Design It in to Your Next Product", Micron Technology, Inc., TN-29-19, http://www.eng.umd.edu/~blj/CS-590.26/micron-tn2919.pdf, Apr. 2010, 27 pages.

(Continued)

*Primary Examiner* — J. H. Hur
(74) *Attorney, Agent, or Firm* — Francis Lammes; Stephen J. Walder, Jr.; William J. Stock

(57) ABSTRACT

Mechanisms are provided, in a non-volatile memory device comprising a non-volatile memory and a memory controller, for controlling an operation of the non-volatile memory device. The non-volatile memory device receives a single combined memory command for accessing the non-volatile memory. The non-volatile memory device decodes the row address and the column address for the word-line to be accessed by the single combined memory command. The non-volatile memory device accesses the word-line such that at least a most significant bit (MSB) page and a least significant bit (LSB) page are accessed simultaneously.

17 Claims, 8 Drawing Sheets

(56) References Cited

OTHER PUBLICATIONS

Kim, Hyunggon et al., "A 159mm2 32nm 32Gb MLC NAND-Flash Memory with 200 MB/s Asynchronous DDR Interface", IEEE International Solid-State Circuits Conference, Session 24, DRAM & Flash Memories, Feb. 10, 2010, 2 pages.

Kim, Jonghong et al., "Low-energy error correction of NAND Flash memory through soft-decision decoding", EURASIP Journal of Advances in Signal Processing 2012, 2012:195, Sep. 5, 2012, 12 pages.

Park, Ki-Tae et al., "A Zeroing Cell-to-Cell Interference Page Architecture With Temporary LSB Storing and Parallel MSB Program Scheme for MLC NAND Flash Memories", IEEE Journal of Solid-State Circuits, vol. 43, No. 4, Apr. 2008, pp. 919-928.

Takeuchi, Ken et al., "A Multipage Cell Architecture for High-Speed Programming Multilevel NAND Flash Memories", IEEE Journal of Solid-State Circuits, vol. 33, No. 8, Aug. 1998, pp. 1228-1238.

\* cited by examiner

SIMULTANEOUS MULTI-PAGE COMMANDS FOR NON-VOLATILE MEMORIES

BACKGROUND

The present application relates generally to an improved data processing apparatus and method and more specifically to mechanisms for accessing multiple pages in a word-line of a non-volatile memory simultaneously.

Flash memory is an electronic non-volatile computer storage medium that can be electrically erased and reprogrammed. Flash memory was developed from electrically erasable programmable read only memory (EEPROM) devices. There are two primary types of flash memory, NAND and NOR type flash memories, named after the logic gates that the cells of the flash memory emulate. Where EEPROMs had to be completely erased before being rewritten, NAND type flash memories may be programmed (written) and read in blocks (or pages) which are generally much smaller than the entire device. NAND type flash memories are used in main memories, memory cards, Universal Serial Bus (USB) flash drives, solid-state drives (SSDs), and the like. NOR type flash memories are generally used as replacements for older EEPROMs and as an alternative to read only memories (ROMs) in some applications.

Flash memory devices store data in individual memory cells which are made up of floating-gate transistors. Traditionally, cells of a flash memory device had two possible states, e.g., high or low, programmed or erased, 1 or 0, or the like, and thus, could only store a single bit per cell. These are referred to as single-level cell (SLC) flash memories. SLC flash memory has the advantage of relatively fast write speeds, low power consumption, and high cell endurance. However, because SLC flash memories only store a single bit per cell, SLC flash memories cost more per megabyte of storage to manufacture. SLC flash memories are used in high-performance memory cards due to their relative faster transfer speeds and longer life.

Multi-level cell (MLC) Slash memories are memory devices capable of storing more than a single bit of information in each cell. In MLC flash memories, multiple levels are provided per cell to allow more bits to be stored using the same number of transistors. Most MLC flash memories, contrary to the two states permitted in SLC flash memories, provide four possible states per cell so that they may store two bits of information per cell. This reduces the amount of margin separating the states and results in a higher possibility of errors. However, the cost of MLC flash memories is lower since a lower number of hardware elements are required per megabyte of storage capacity. Stated another way, a MLC flash memory stores twice as much data as a SLC flash memory and thus, a lower number is necessary for most applications.

Further, categories of MLC flash memories have been developed that support eight possible states per cell, thereby allowing each cell to store up to three bits of information per cell and sixteen 16 possible states per cell, thereby allowing each cell to store up to four bits of information per cell. Flash memories that utilize such cells are referred to as triple-level cell (TLC) and quad-level cell (QLC) flash memories, respectively.

SUMMARY

In one illustrative embodiment, a method, in a non-volatile memory device comprising a non-volatile memory and a memory controller, for controlling an operation of the non-volatile memory device is provided. The method comprises receiving, by the non-volatile memory device, a single combined memory command for accessing the non-volatile memory. The method further comprises decoding, by the non-volatile memory device, the row address and the column address for the word-line to be accessed by the single combined memory command. Moreover, the method comprises accessing, by the non-volatile memory device, the word-line such that at least a most significant bit (MSB) page and a least significant bit (LSB) page are accessed simultaneously.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1A:
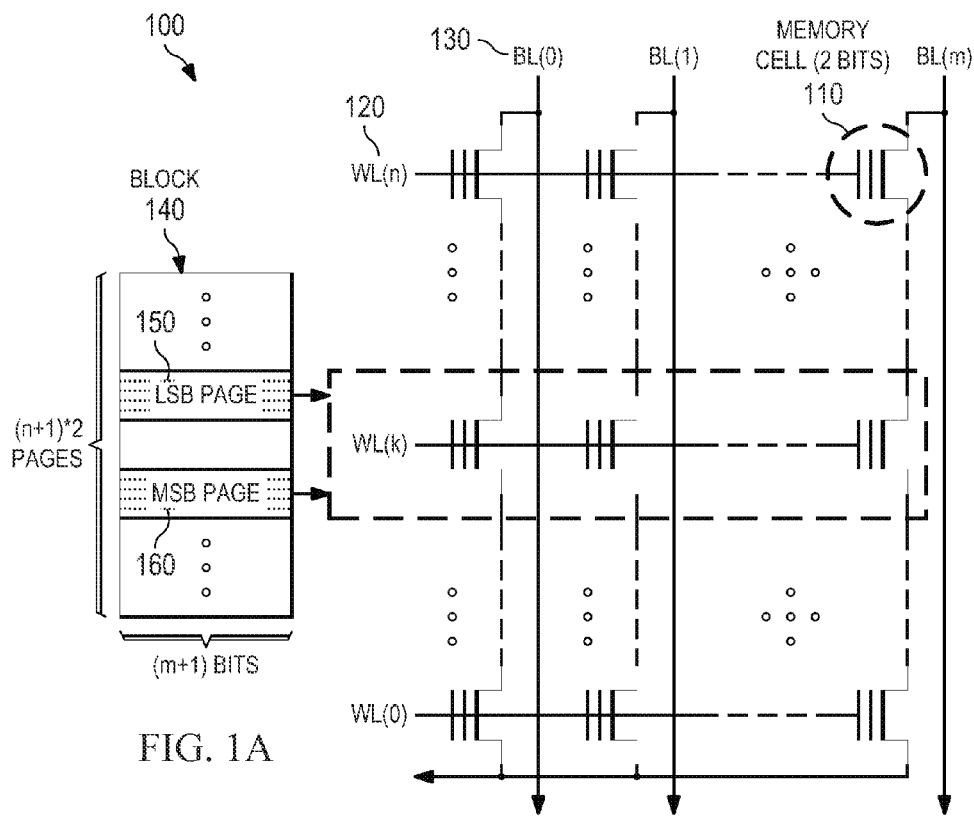
FIG. 1A is an example diagram of the organization of a MLC flash memory device in accordance with an illustrative embodiment.

The illustrative embodiments provide mechanisms for accessing multiple pages in a word-line of a non-volatile memory simultaneously. In conventional flash memory systems, bit pair pages of a word-line are programmed or read from the flash memory sequentially. That is, in the case of a multi-level cell (MLC) flash memory, the least significant bit (LSB) page of the word-line is programmed/read first and then the most significant bit (MSB) page of the word-line is programmed/read. The mechanisms of the illustrative embodiments provide reduced power consumption, reduced timing, reduced current method for programming to and reading from a non-volatile memory by programming or reading the bit pair pages simultaneously. That is, the memory controller controlling the non-volatile memory identifies addresses and data belonging to a same word-line and combines the addresses and data into a single memory command that is issued to the non-volatile memory if the command is a program command or identifies addresses belonging to a same word-line and combines the addresses into a single memory command that is issued to the non-volatile memory if the command is a read command. The non-volatile memory processes the combined single memory command such that, in the case of a programming command, all memory cells associated with the word-line are programmed simultaneously and, in the case of a read command, all memory cells associated with the word-line are read simultaneously. In the illustrative embodiments, the non-volatile memory is a NAND type flash memory, which may be a Three-Dimensional Vertical NAND (3D V-NAND) flash memory, a phase change Hash memory (PCM), a Spin-Transfer Torque Magnetic Random Access Memory (STT-MRAM), or the like.

In some illustrative embodiments, the mechanisms of the illustrative embodiments operate to control programming/reading of data to pages of a non-volatile memory system/device. The non-volatile memory receives the combined memory command such as a Row Address Strobe (RAS) command, a Column Address Strobe (CAS) command, a programming command (data-in), or a read command (data-out). RAS commands and CAS commands are conventional commands provided in almost all memory devices from DRAM, Flash, PCM and STT-MRAM. RAS commands decode row addresses and enable corresponding word-line and bit-line, while CAS commands decode column addresses and enable corresponding word-line and bit-line. If the combined memory command is a programming command, the mechanisms of the illustrative embodiments store the data associated with the combined memory command in page buffers. In the case of a MLC, there are two page buffers: an MSB page buffer and an LSB page buffer. In the case of a triple-level cell (TLC) flash memory device, there are three page buffers: an MSB page buffer, a center significant bit (CSB) page buffer, and an LSB buffer. In the case of a quad-level cell (QLC) flash memory device, there are four page buffers: an MSB page buffer, a center-high significant bit (CHSB) page buffer, a center-low significant bit (CLSB) page buffer, and an LSB buffer. In addition to storing the data associated with the combined memory command, a row address decoder and column address decoder in the non-volatile memory decode the combined memory command in order to determine which row and column is being programmed or read. Once the row and column addresses are decoded, the non-volatile memory programs the word-line associated with the decoded row address and column address with the data stored in the page buffers. If the combined memory command is a read command, then once the row and column addresses are decoded, then non-volatile memory reads the data from the word-line associated with the decoded row address and column address and stores the data in the page buffers. The non-volatile memory then sends this data to the memory controller in a combined response and the memory controller stores the data in a read data queue for later transmission to a host device.

It should be appreciated that the programming or reading of a word-line may be performed as full-page, half-page, or a combination of full-page or half-page. That is, for a MLC flash memory device, a full-page of both the MSB and the LSB may be programmed or read simultaneously, a half-page of both the MSB and LSB may be programmed or read simultaneously, a full-page of the MSB may be programmed or read while only a half-page of the LSB is programmed or read, or a half-page of the MSB may be programmed or read while a full-page of the LSB is programmed or read. Programming or reading only a half-page of the MSB and/or LSB is possible when the host knows that data already programmed to or read from the non-volatile memory has not been changed. Similar combinations are associated with both TLC and QLC flash memories, such that, for a TLC flash memory, a full-page of the MSB, the CSB, and the LSB may be programmed or read simultaneously, a half-page of the MSB, the CSB, and LSB may be programmed or read simultaneously, or a combination of full-pages and half-pages may be programmed to or read from the MSB, the CSB, and/or the LSB. For the QLC, a full-page of the MSB, the CHSB, the CLSB, and the LSB may be programmed or read simultaneously, a half-page of the MSB, the CHSB, the CLSB, and the LSB may be programmed or read simultaneously, or a combination of full-pages and half-pages may be programmed to or read from the MSB, the CHSB, the CLSB, and/or the LSB.

These and other features and advantages of the illustrative embodiments will be described in greater detail hereafter. However, before beginning the discussion of the various aspects of the illustrative embodiments, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, a procedure, or a computer program product. In the case of a procedure, the procedure is implemented by one or more devices, apparatus, computers, data processing systems, or the like. In the case of a computer program product, the logic represented by computer code or instructions embodied in or on the computer program product is executed by one or more hardware devices in order to implement the functionality or perform the operations associated with the specific "mechanism." Thus, the mechanisms described herein may be implemented as specialized hardware, software executing on general purpose hardware, software instructions stored on a medium such that the instructions are readily executable by specialized or general purpose hardware, a procedure, or method for executing the functions, or a combination of any of the above.

The present description and claims may make use of the terms "a", "at least one of", and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Before discussing the improvements made by the illustrative embodiments, it is best to first have an understanding of the observations that lead to the devising of these illustrative embodiments and improvements. In order to illustrate the problems with known multi-level cell (MLC) flash memory devices and the observations of their behavior that lead to the devising of the illustrative embodiments, one must first understand the operation of a MLC flash memory device in general.

FIG. 1A is an example diagram of the organization of a MLC flash memory device in accordance with an illustrative embodiment. The particular MLC flash memory device shown in FIG. 1A is of an all-bit-line (ABL) architecture, meaning that all of the bit lines connected to page buffers are sensed simultaneously.

As shown in FIG. 1A, the MLC flash memory device 100 is comprised of a plurality of cells 110 arranged as word-lines (WLs) 120 (shown as rows) and having bitlines (BLs) 130 (shown as columns) to allow addressing the individual cells. That is, the intersection of a word-line 120 and bitline 130 constitutes the address of the cell 110. There are n+1 word-lines 120, i.e. WL(0) to WL(n), and m+1 bitlines 130, i.e. BL(0) to BL(m)

The MLC flash memory device 100 is further logically configured as blocks of memory 140. Each block of memory 140 comprises one or more pages of memory 150, 160. In a MLC flash memory device 100, certain pages 150 of the block 140 store the least significant bits of the word-lines 120 while other pages 160 of the block 140 store the most significant bits of the word-lines 120. Thus, for a single block of memory 140, there are (n+1)*2 pages 150, 160, i.e. 2 pages for each word-line—one to store the least significant bits (LSBs) 150 and another to store the most significant bits (MSBs) 160 in the word-line 120. Each page has m+1 bits, i.e. a number of bits equal to the number of cells in the word-line 120. Thus, the size of the memory block is (n+1)*(m+1)*2 in this case.

Figure 1B:
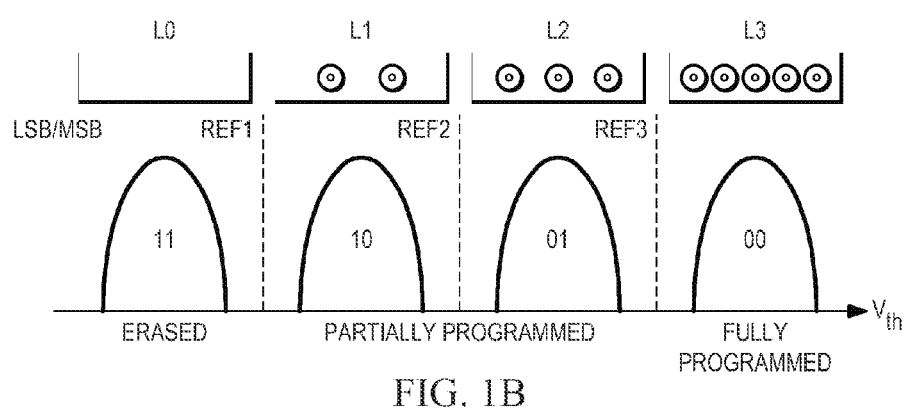
FIG. 1B illustrates the four states that a cell may have in accordance with an illustrative embodiment.

In an MLC flash memory device 100, each cell stores more than one bit of data. In the depicted example, the cells 110 store 2 bits of data and thus, have four states. FIG. 1B illustrates the four states that a cell 110 may have in accordance with an illustrative embodiment. As shown in FIG. 1B, the cell 110 may have various voltage states relative to different reference voltages REF1-REF3 for the different threshold voltages that the cell 110 may have. For example, if the cell 110 is in stated L1, then the threshold voltage for the cell 110 is REF2. L0-L3 depict the relative number of electrons that will be stored at each threshold voltage level. These voltage states include an erased stated (11), one of two partially programmed states (10 or 01), or a fully programmed state (00).

Figure 1C:
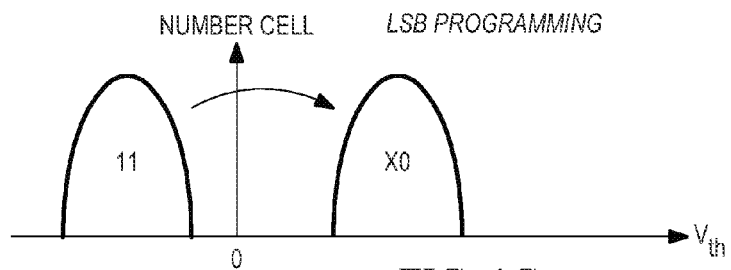
FIG. 1C illustrates different cell distributions for LSB programming in accordance with an illustrative embodiment.
Figure 1D:
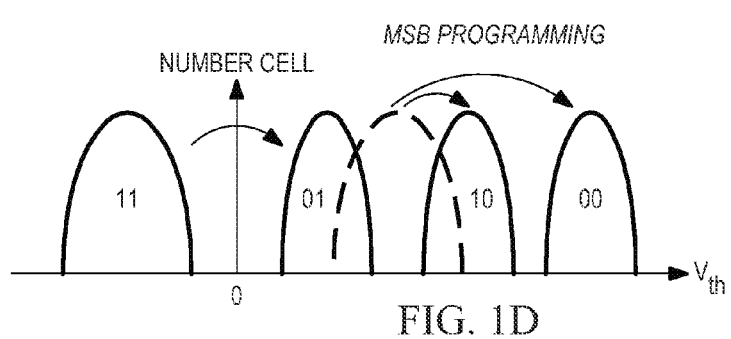
FIG. 1D illustrates four different distributions for MSB programming in accordance with an illustrative embodiment.

With cells that are able to store more than one bit of data, such as the MLC flash memory device 100 cells 110 in FIG. 1A, programming of the cells requires more sophisticated sensing and voltage manipulations due to the multiple states that the cells 110 may have. For example, LSB programming in cells 110 of a word-line 120 only require two different cell distributions as shown in FIG. 1C in accordance with an illustrative embodiment. That is, with LSB cells, the cell need only be brought to a voltage other than erased (11) to indicate that the cell has been programmed since the LSB cells can only store one of two values, i.e. either a "1" or a "0." FIG. 1C illustrates bringing the LSB cell to a "0." MSB programming, on the other hand may take any of four different distributions, since MSB cells can store multiple values, and thus, requires a much more sophisticated sensing of the voltage distributions, as shown in FIG. 1D in accordance with an illustrative embodiment. As a result, the MSB programming exhibits a longer latency than the LSB programming.

Figure 2:
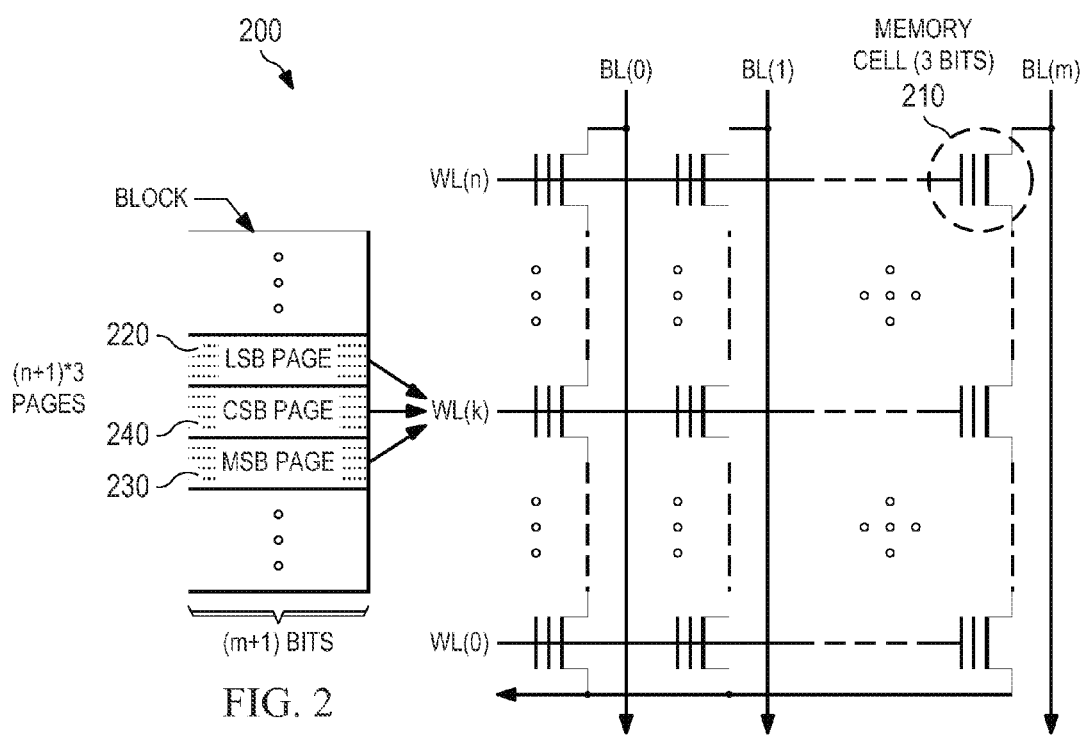
FIG. 2 illustrates another type of MLC flash memory device in which three bits are stored per cell of memory, referred to as a triple-level cell (TLC) flash memory device in accordance with an illustrative embodiment.

FIG. 2 illustrates another type of MLC flash memory device in which three bits are stored per cell of memory, referred to as a triple-level cell (TLC) flash memory device in accordance with an illustrative embodiment. The TLC flash memory device 200 operates in a similar manner to that of the MLC flash memory of FIG. 1A with the exception that each cell 210 is capable of storing 3 bits and has 8 possible voltage distribution states. Moreover, in addition to the LSB page 220 and MSB page 230, the bits in the word-lines of the TLC flash memory device 200 include center significant bits (CSBs) and corresponding CSB pages 240. As a result, a TLC flash memory device 200 is organized into blocks with each block having LSB, CSB, and MSB pages 220-240. Thus, this architecture has n+1 word-lines (0 to n), m+1 bitlines (0 to m), can store 3 bits per cell, and has (n+1)*3 pages per block of memory.

Figure 3:
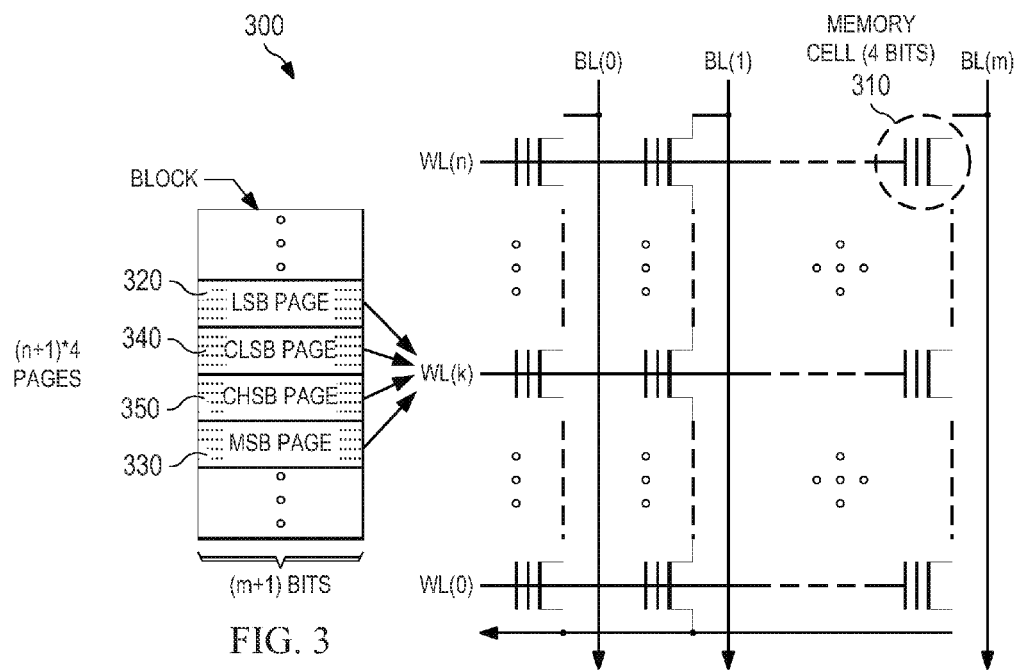
FIG. 3 illustrates another type of MLC flash memory device in which four bits are stored per cell of memory, referred to as a quad-level cell (QLC) flash memory device in accordance with an illustrative embodiment.

FIG. 3 illustrates another type of MLC flash memory device in which four bits are stored per cell of memory, referred to as a quad-level cell (QLC) flash memory device in accordance with an illustrative embodiment. The QLC flash memory device 300 operates in a similar manner to that of the MLC flash memory of FIG. 1A with the exception that each cell 310 is capable of storing 4 bits and has 16 possible voltage distribution states. Moreover, in addition to the LSB page 320 and MSB page 330, the bits in the word-lines of the QLC flash memory device 300 include center-low significant bits (CLSBs) and corresponding CLSB pages 340 and center-high significant bits (CHSBs) and corresponding CHSB pages 350. As a result, a QLC flash memory device 300 is organized into blocks with each block having LSB, CLSB, CHSB, and MSB pages 320-350. Thus, this architecture has n+1 word-lines (0 to n), m+1 bitlines (0 to m), can store 4 bits per cell, and has (n+1)*4 pages per block of memory.

As will be described hereafter, the mechanisms of the illustrative embodiments may be extended to TLC and QLC flash memory devices as well as the MLC flash memory devices. For ease of explanation, the following description will primarily focus on the implementation of the mechanisms of the illustrative embodiments to MLC flash memory devices having 2 bits per cell. However, it will be apparent to those of ordinary skill in the art, in view of a reading of the present description, that these mechanisms may be also be utilized with other types of MLC flash memory devices, such as TLC and QLC flash memory devices, without departing from the spirit and scope of the present invention.

Figure 4:
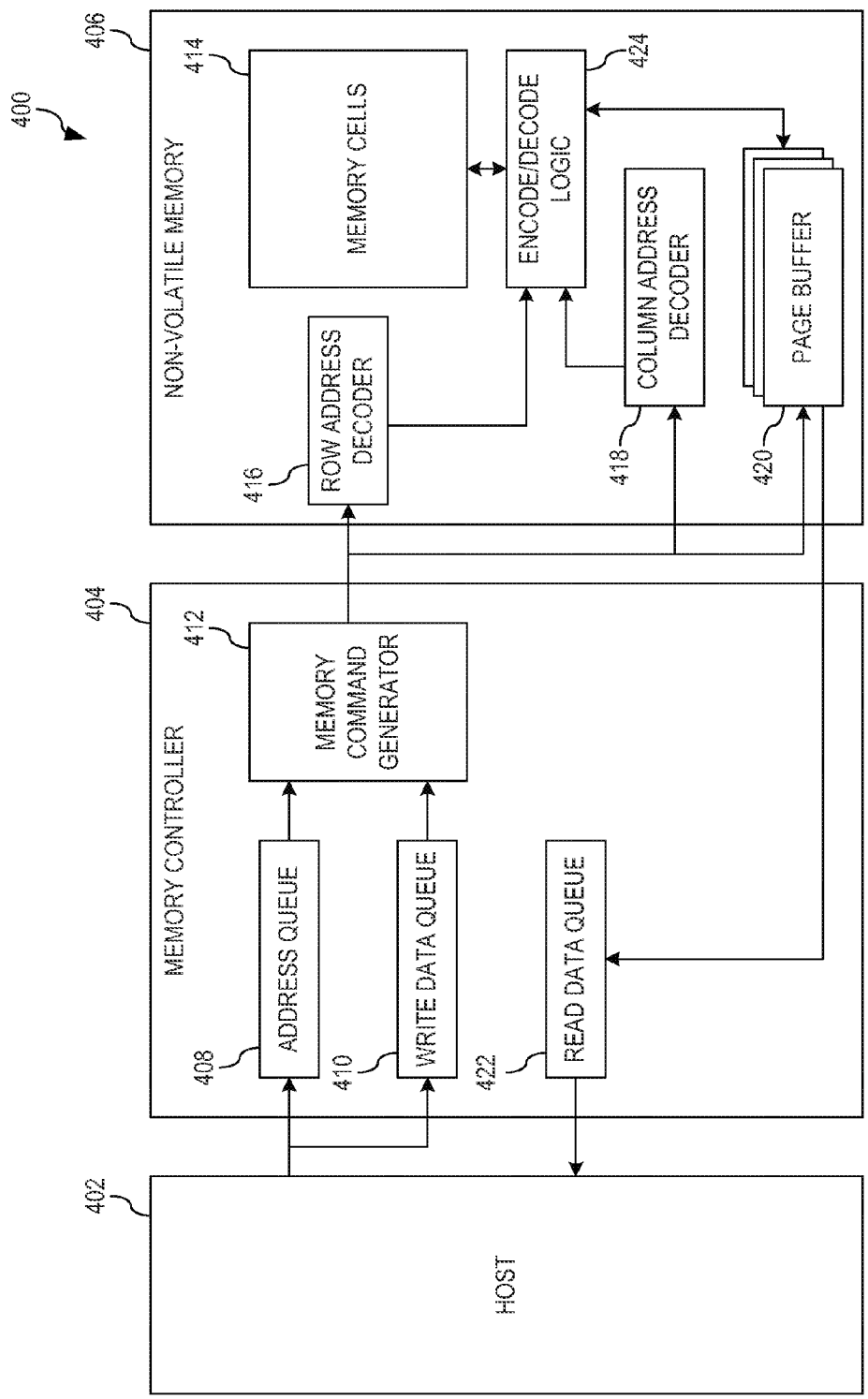
FIG. 4 depicts a functional block diagram describing a mechanism for accessing multiple pages in a word-line of a non-volatile memory simultaneously in accordance with an illustrative embodiment.

FIG. 4 depicts a functional block diagram describing a mechanism for accessing multiple pages of a word-line of a non-volatile memory simultaneously in accordance with an illustrative embodiment. Data processing system 400 comprises host 402, memory controller 404, and non-volatile memory 406. In operation, when host 402 issues a program command to program a word-line in non-volatile memory 406, host 402 sends the address where the data is to be written and the corresponding data to memory controller 404. Memory controller 404 stores the address for the program in address queue 408 as a most significant bit (MSB) address and a least significant bit (LSB) address. Likewise, memory controller 404 stores the data associated with the command in write data queue 410 as MSB data and LSB data. In the event that the command is a read command, memory controller 404 stores the address for the read in address queue 408 as an MSB address and an LSB address.

Responsive to receiving an indication of the received command from host 402, memory command generator 412 in memory controller 404 identifies the addresses of the word-line, an MSB address and an LSB address, associated with the command in address queue 408. Additionally, if the command is a program command, memory command generator 412 identifies the data, MSB data and LSB data, of the word-line associated with the program command in write data queue 410. Memory command generator 412 then combines the addresses and command into a single combined memory command, which memory controller 404 then sends to non-volatile memory 406.

Figure 5A:
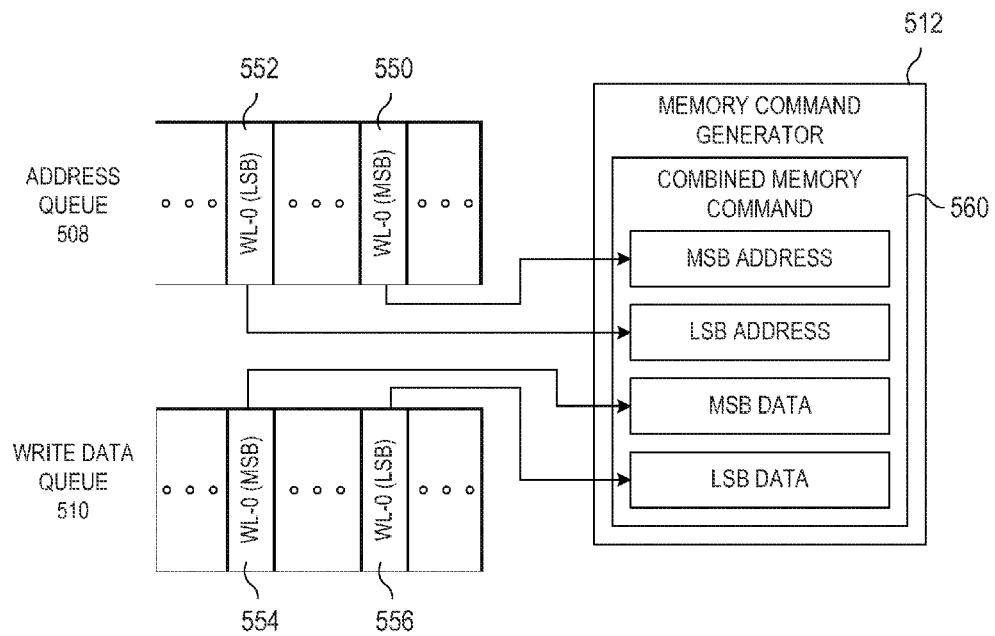
FIG. 5A illustrates the combination of addresses and data for a program command of a word-line in a multi-level cell (MLC) flash memory device in accordance with an illustrative embodiment.
Figure 5B:
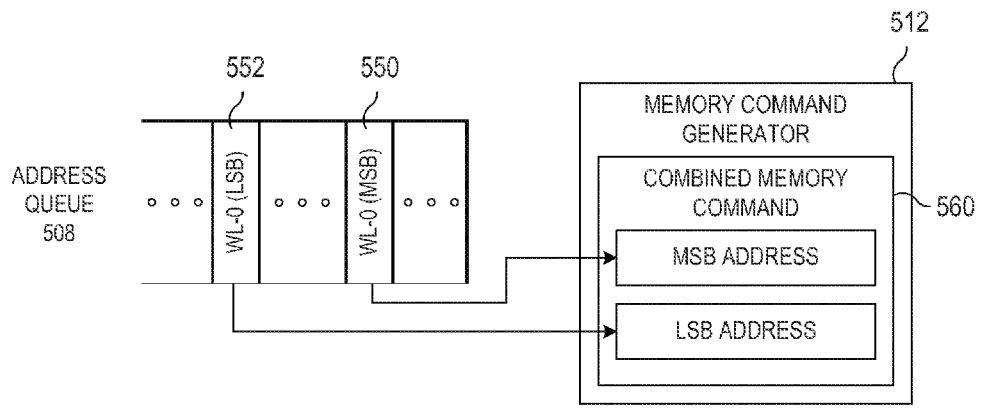
FIG. 5B illustrates the combination of addresses for a read command of a word-line in a multi-level cell (MLC) flash memory device in accordance with an illustrative embodiment.

FIG. 5A illustrates the combination of addresses and data for a program command of a word-line in a multi-level cell (MLC) flash memory device in accordance with an illustrative embodiment. In the illustration, memory command generator 512 identifies MSB address 550 and LSB address 552 of the word-line from address queue 508, which are inserted into combined memory command 560. Additionally, memory command generator 512 identifies MSB data 554 and LSB data 556 of the word-line from write data queue 510, which are inserted into combined memory command 560. FIG. 5B illustrates the combination of addresses for a read command of a word-line in a multi-level cell (MLC) flash memory device in accordance with an illustrative embodiment. In the illustration, memory command generator 512 identifies MSB address 550 and LSB address 552 of the word-line from address queue 508, which are inserted into combined memory command 560.

It should be appreciated that the programming or reading of a word-line may be performed as full-page, half-page, or a combination of full-page or half-page. That is, for a MLC flash memory device, a full-page of both the MSB and the LSB may be programmed or read simultaneously, a half-page of both the MSB and LSB may be programmed or read simultaneously, a full-page of the MSB may be programmed or read while only a half-page of the LSB is programmed or read, or a half-page of the MSB may be programmed or read while a full-page of the LSB is programmed or read. Programming or reading only a half-page of the MSB and/or LSB is passible when the host knows that data already programmed to or read from the non-volatile memory has not been changed. Although not illustrated, similar combinations are associated with both TLC and QLC flash memories, such that, for a TLC flash memory, a full-page of the MSB, the CSB, and the LSB may be programmed or read simultaneously, a half-page of the MSB, the CSB, and LSB may be programmed or read simultaneously, or a combination of full-pages and half-pages may be programmed to or read from the MSB, the CSB, and/or the LSB. For the QLC, a full-page of the MSB, the CHSB, the CLSB, and the LSB may be programmed or read simultaneously, a half-page of the MSB, the CHSB, the CLSB, and LSB may be programmed or read simultaneously, or a combination of full-pages and half-pages may be programmed to or read from the MSB, the CHSB, the CLSB, and/or the LSB.

Figure 6:
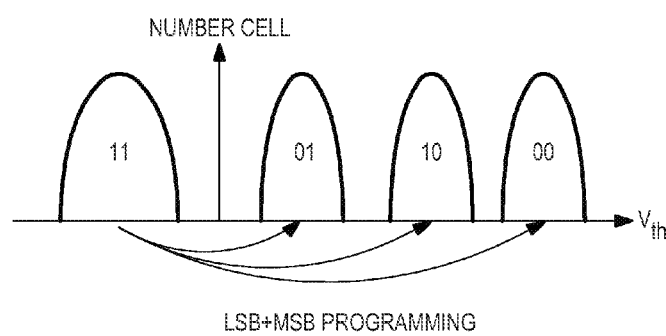
FIG. 6 depicts a programming of an LSB and an MSB associated with a memory cell within an MLC flash memory device in accordance with an illustrative embodiment.

Returning to FIG. 4, non-volatile memory 406 comprises memory cells 414, row address decoder 416, column address decoder 418, two or more page buffers 420, and encode/decode logic 424. Page buffers 420 comprise an MSB page buffer and LSB buffer if non-volatile memory 406 is a MLC flash memory device, comprise an MSB page buffer, a CSB page buffer, and an LSB page buffer if non-volatile memory 406 is a TLC flash memory device, and comprise an MSB page buffer, a CHSB page buffer, a CLSB page butter, and an LSB page buffer if non-volatile memory 406 is a QLC flash memory device. Upon receiving the single combined memory command from memory controller 404, row address decoder 416 decodes the row portion of the combined memory command and column address decoder 418 decodes the column portion of the combined memory command in order to determine which row and column is being programmed or read. In the case of a program command, page buffers 420 store the data from the combined memory command to be programmed. If the combined memory command is a program command, once the row and column addresses are decoded, encode/decode logic 424 determines the target voltage states for each cell of the word-line that is to be programmed based on both the MSB data and the LSB data stored in page buffers 420 in case of an MLC flash memory device. Once encode/decode logic 424 identifies the target voltage states, non-volatile memory 406 programs the MSBs and LSBs of the memory cells of the word-line with the identified target voltage states simultaneously, as is illustrated in FIG. 6 below. If the combined memory command is a read command, once the row and column addresses are decoded, encode/decode logic 424 determines the voltage states of the memory cells that are to be read out to page buffers 420 based on the voltage states of the memory cells of the word-line in memory cells 414. Once encode/decode logic 424 identifies the voltage states, non-volatile memory 406 reads the voltage states out as MSB data and LSB data in page buffers 420 simultaneously.

Responsive to a successful programming of the memory cells associated with the decoded row address and column address, non-volatile memory 406 sends an acknowledgement of successful programming to memory controller 404, which is then acknowledged to host 402. Responsive to a successful read of the memory cells associated with the decoded row address and column address, non-volatile memory 406 sends the read data from page buffers 420 to memory controller 404. Memory controller 404 stores the data in read data queue 422, which is then sent onto host 402.

With regard to an MLC flash memory device, as opposed to the programming of memory in cells of a word-line for the LSB as shown in FIG. 1C, which is programmed to a "X0," and then the programming of the MSB as shown in FIG. 1D, which may be programmed to "10" or "00" because of the LSB programming, the programming method of the illustrative embodiments does not sequentially program the LSB first and then the MSB. Rather, as is shown in FIG. 6 in accordance with, an illustrative embodiment, the illustrative embodiments program the LSB and the MSB associated with a memory cell within an MLC flash memory device such that, from the erased state of "11," the non-volatile memory determines the $V_{th}$ programming level based on the MSB data and the LSB data so that the MSB and the LSB of a memory cell are directly and simultaneously programmed to a $V_{th}$ of "01," a $V_{th}$ of "10," or $V_{th}$ of "00." For a TLC flash memory device, there are seven possible translations for $V_{th}$ of a memory cell: "000," "001," "010," "011," "100," "101," and "110," all of which can be directly and simultaneously programmed from the erased state of "111." For a QLC flash memory device, there are 15 possible translations for $V_{th}$ of a memory cell: "0000," "0001," "0010," "0011," "0100," "0101," "0110," "0111," "1000," "1001,""1010," "1011," "1100," "1101," "1110," all of which can be directly and simultaneously programmed from the erased state of "1111."

Figure 7:
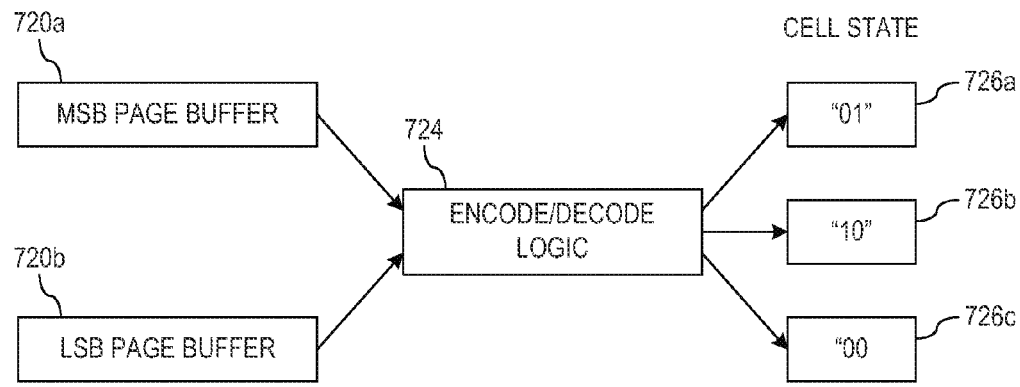
FIG. 7 illustrates an exemplary encoding of programming data from the page buffers with which to program the memory cells in accordance with an illustrative embodiment.

FIG. 7 illustrates an exemplary encoding of programming data from the page buffers with which to program the memory cells in accordance with an illustrative embodiment. Responsive to receiving a programming command, encode/decode logic 724 determines the target voltage state that is to be programmed for each memory cell of the word-line based on, for an MLC flash memory device, both the MSB data stored in MSB page buffer 720a and the LSB data stored LSB page buffer 720b. For a particular memory cell, if the MSB data indicates a "1" and the LSB data indicates a "0," then encode/decode logic 724 would determine an encode cell state of 726b, which correlates to "10," from the three cell states 726a-726c, which correlate to "01," "10," and "00," respectively.

Figure 8:
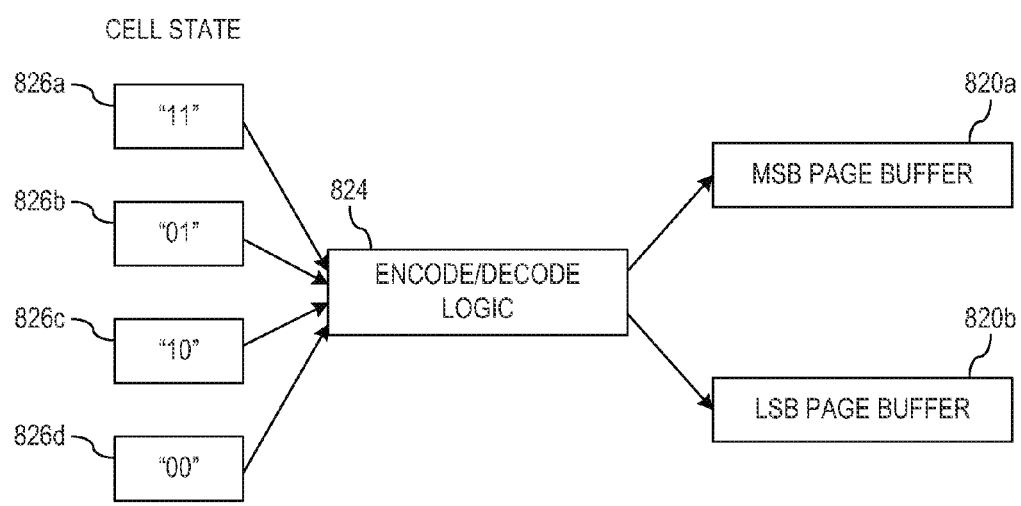
FIG. 8 illustrates an exemplary decoding of data in the memory cells associated with a word-line to a set of page buffers in accordance with an illustrative embodiment.

FIG. 8 illustrates an exemplary decoding of data in the memory cells associated with a word-line to a set of page buffers in accordance with an illustrative embodiment. Responsive to receiving a read command, encode/decode logic 824 determines the voltage states of the memory cells associated with a word-line identified by a decoded row address and column address. For a particular memory cell, once encode/decode logic 824 identifies the voltage states of the MSB and LSB, for example the MSB data indicates a "0" and the LSB data indicates a "0," then encode/decode logic 824 would determine an encode cell state of 826d, which correlates to "00," from the four cell states 826a-826d, which correlate to "11", "01," "10," and "00," respectively. For the particular memory cell, encode/decode logic 824 then reads a "0" out MSB page buffer 820a and a "0" out to LSB page buffer 820b, simultaneously.

Figure 9:
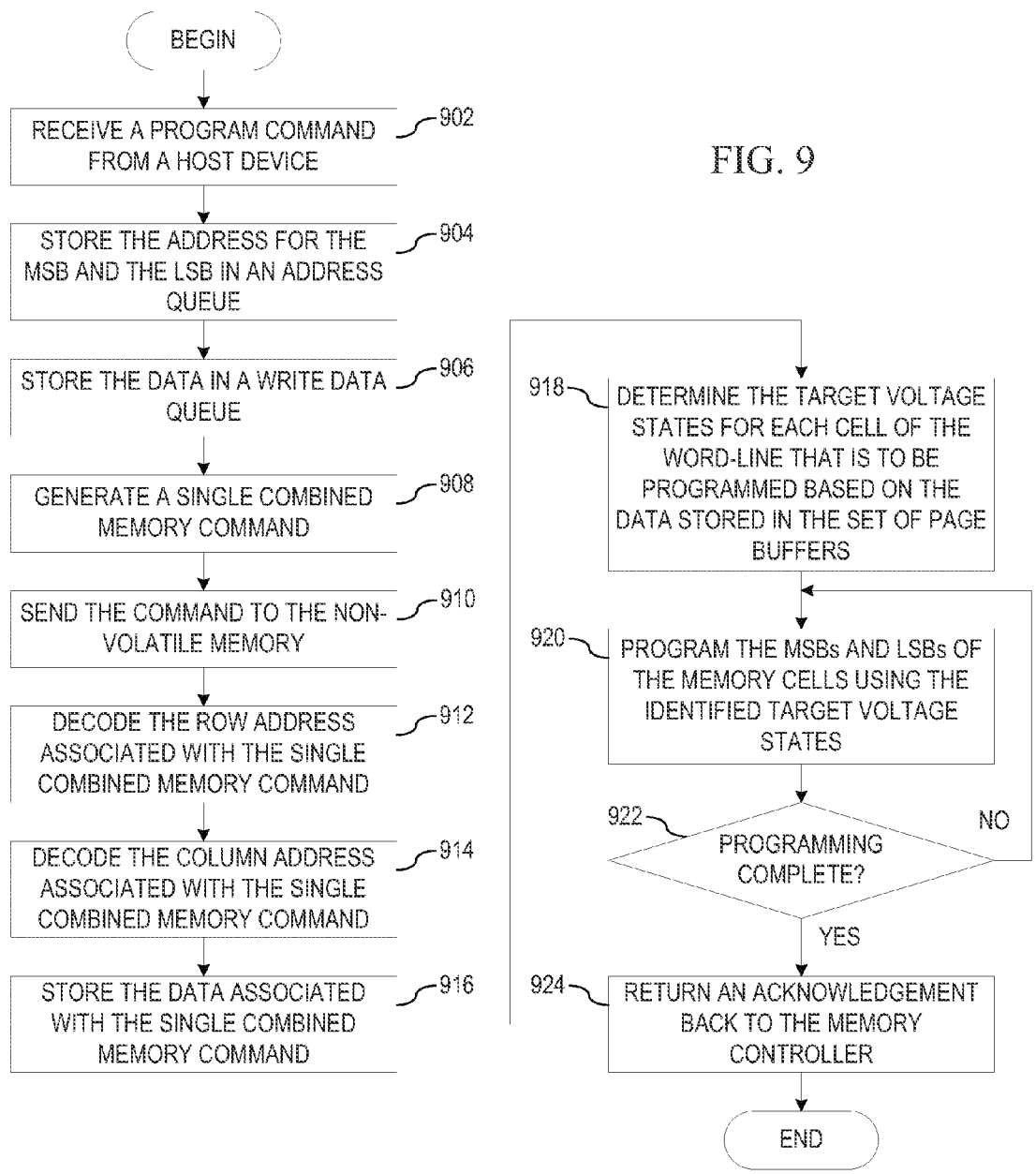
FIG. 9 is a flowchart outlining an example operation for programming multiple pages of word-line in a non-volatile memory simultaneously in accordance with one illustrative embodiment.

FIG. 9 is a flowchart outlining an example operation for programming multiple pages of word-line in a non-volatile memory simultaneously in accordance with one illustrative embodiment. For purposes of the description of FIG. 9, it will be assumed that the flash memory device is a MLC flash memory device with cells storing 2 bits of information. As shown in FIG. 9, the operation starts with the memory controller receiving a program command from a host device (step 902). The memory controller stores the address for the MSB and the LSB in an address queue (step 904) and the data associated with the program command in a write data queue (step 906). The memory controller then utilizes a memory command generator to generate a single combined memory command such that the memory command generator reads the MSB address from the address queue, the LSB address from the address queue, the MSB data from the write data queue, and the LSB data from the write data queue (step 908). Once the memory command generator has generated the single combined memory command, the memory controller sends the single combined memory command to the non-volatile memory (step 910).

Upon receiving the single combined memory command, a row address decoder in the non-volatile memory decodes the row address associated with the single combined memory command (step 912), a column address decoder decodes the column address associated with the single combined memory command (step 914), and a set of page buffers stores the data associated with the single combined memory command (step 916). In this example, since the non-volatile memory is a MLC flash memory, then there are two page buffers: one that stores the MSB data and the other that stores the LSB data. Encode/decode logic in the non-volatile memory then determines the target voltage states for each cell of the word-line that is to be programmed based on the data stored in the set of page buffers (step 918). Once the encode/decode logic determines the target voltage states, encode/decode logic programs the MSBs and LSBs of the memory cells identified by the decoded row address and decoded column address using the identified target voltage states (step 920). The non-volatile memory then checks the status of the programming (step 922). If at step 922 the programming is not complete, the operation returns to step 920. If at step 922 the programming completes, then the non-volatile memory returns an acknowledgement back to the memory controller, which is then returned to the host device (step 924), with the operation ending thereafter.

Figure 10:
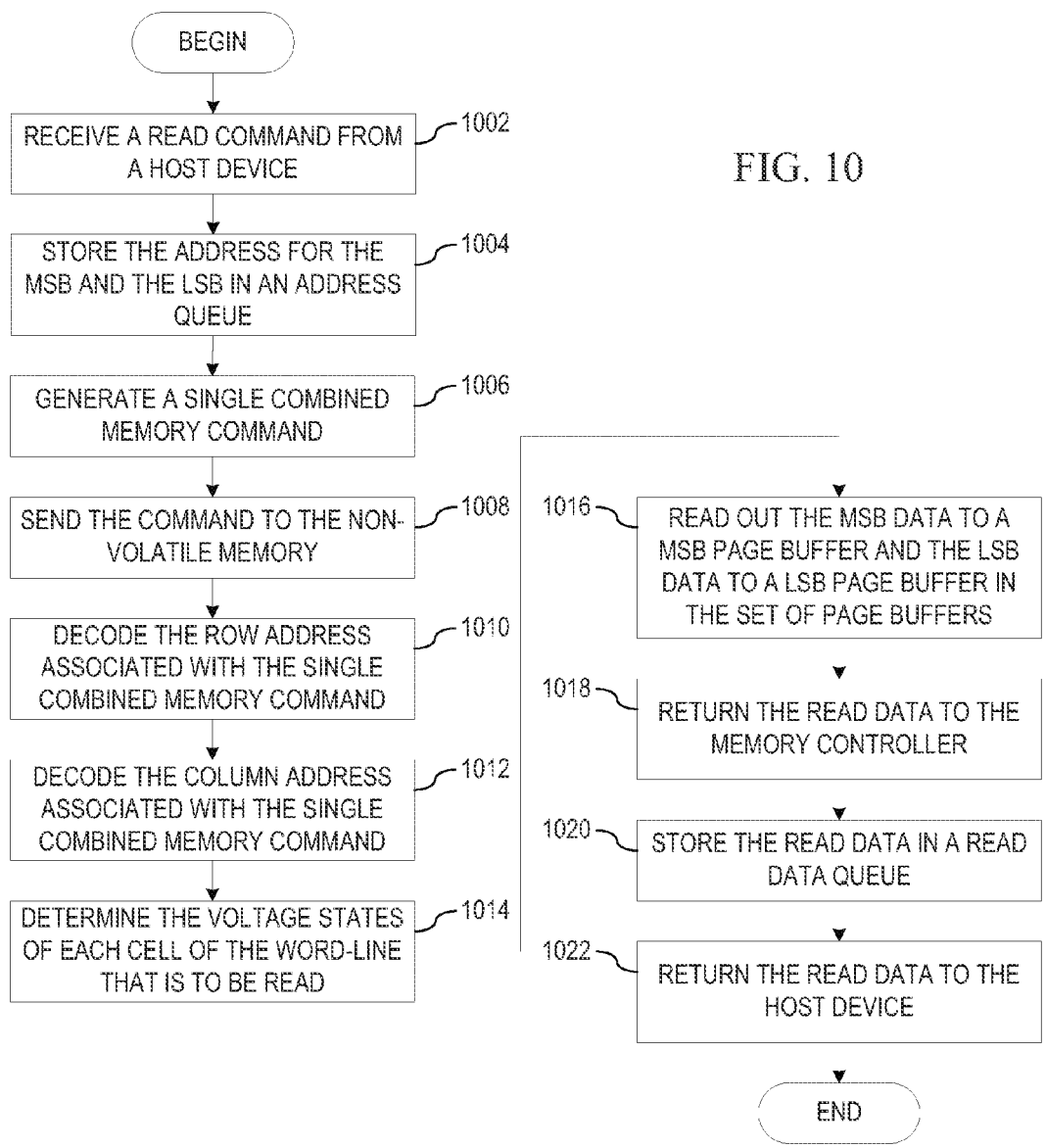
FIG. 10 is a flowchart outlining an example operation for reading multiple pages of word-line in a non-volatile memory simultaneously in accordance with one illustrative embodiment.

FIG. 10 is a flowchart outlining an example operation for reading multiple pages of word-line in a non-volatile memory simultaneously in accordance with one illustrative embodiment. For purposes of the description of FIG. 10, it will be assumed that the flash memory device is a MLC flash memory device with cells storing 2 bits of information. As shown in FIG. 10, the operation starts with the memory controller receiving a read command from a host device (step 1002). The memory controller stores the address for the MSB and the LSB in an address queue (step 1004). The memory controller then utilizes a memory command generator to generate a single combined memory command such that the memory command generator reads the MSB address from the address queue and the LSB address from the address queue (step 1006). Once the memory command generator has generated the single combined memory command, the memory controller sends the single combined memory command to the non-volatile memory (step 1008).

Upon receiving the single combined memory command, a row address decoder in the non-volatile memory decodes the row address associated with the single combined memory command (step 1010) and a column address decoder decodes the column address associated with the single combined memory command (step 1012). Encode/decode logic in the non-volatile memory then determines the voltage states of each cell of the word-line that is to be read using the decoded row address and decoded column address (step 1014). Once the encode/decode logic determines the voltage states of each cell of the word-line, encode/decode logic reads out the MSB data to an MSB page buffer and the LSB data to an LSB page buffer in the set of page buffers (step 1016). The non-volatile memory returns the read data to the memory controller (step 1018). The memory controller stores the read data in read data queue (step 1020) and then returns the read data to the host device (step 1022), with the operation ending thereafter.

Thus, the illustrative embodiments provide mechanisms for accessing multiple pages in a word-line of a non-volatile memory simultaneously. A memory controller controlling the non-volatile memory identifies addresses and data belonging to a same word-line and combines the addresses and data into a single memory command that is issued to the non-volatile memory if the command is a programming command or identifies addresses belonging to a same word-line and combines the addresses and data into a single memory command that is issued to the non-volatile memory if the command is a read command. The non-volatile memory processes the combined single memory command such that, in the case of a programming command, all memory cells associated with the word-line are programmed simultaneously and, in the case of a read command, all memory cells associated with the word-line are read simultaneously.

It should be appreciated that aspects of the illustrative embodiments may take the form of an entirely hardware embodiment, an entirely software embodiment or an embodiment containing both hardware and software elements. In one example embodiment, the mechanisms of flash memory controller of the illustrative embodiments are implemented in software or program code, which includes but is not limited to firmware, resident software, microcode, etc.

The flash memory device mechanisms of the illustrative embodiments may be utilized with, integrated in, or otherwise associated with a data processing system computing system, or the like. A data processing system with which the mechanisms of the illustrative embodiments may be implemented will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A method, in a non-volatile flash memory device comprising a non-volatile flash memory and a memory controller, for controlling an operation of the non-volatile flash memory device, the method comprising:

receiving, by the non-volatile flash memory device, a single combined memory command for accessing the non-volatile flash memory, wherein each cell of the non-volatile flash memory physically stores three or more bits per cell and has at least eight possible threshold voltage distribution states;

decoding, by the non-volatile flash memory device, a row address and a column address for a word-line to be accessed by the single combined memory command; and accessing, by the non-volatile flash memory device, the word-line such that at least a most significant bit (MSB) page, a least significant bit (LSB) page, and at least one other significant bit page are accessed simultaneously, wherein the access to the word-line is selected from the group consisting of a programming of the word-line and a read of the word-line, wherein the programming of the word-line comprises determining, by the non-volatile flash memory device, a target voltage state for each memory cell of the word-line by accessing at least MSB data, LSB data, and at least one other significant bit of data that is to be programmed to the word-line; and programming, by the non-volatile flash memory device, each memory cell of the word-line according to the determined target voltage states, wherein the read of the word-line comprises determining, by the non-volatile flash memory device, a voltage state of each memory cell of the word-line; and reading out, by the non-volatile flash memory device, the voltage states such that at least the MSB portion of the voltage state is written to an MSB page buffer, the LSB portion of the voltage state is written to an LSB page buffer, and the at least one other significant bit portion of the voltage state is written to at least one other significant bit page buffer, and wherein the access to the word-line is selected from the group consisting of:

a full-page access to the MSB page, a half-page access to the LSB page, and full-page access to the at least one other significant bit page;

a full-page access to the MSB page, a full-page access to the LSB page, and half-page access to the at least one other significant bit page, a full-page access to the MSB page, a half-page access to the LSB page, and half-page access to the at least one other significant bit page;

a half-page access to the MSB page, a full-page access to the LSB page, and full-page access to the at least one other significant bit page;

a half-page access to the MSB page, a half-page access to the LSB page, and full-page access to the at least one other significant bit page; and a half-page access to the MSB page, a full-page access to the LSB page, and half-page access to the at least one other significant bit page.

2. The method of claim 1, wherein the at least one other significant bit is a center significant bit (CSB) and wherein the programming of the word-line further comprises:
determining, by the non-volatile flash memory device, a target voltage state for each memory cell of the word-line by further accessing the center significant bit (CSB) to be programmed to the word-line; and
programming, by the non-volatile flash memory device, each memory cell of the word-line according to the determined target voltage states.

3. The method of claim 1, wherein the at least one other significant bit is a center-high significant bit (CHSB) and a center-low significant bit (CLSB) and wherein the programming of the word-line further comprises:
determining, by the non-volatile flash memory device, a target voltage state for each memory cell of the word-line by further accessing the center-high significant bit (CHSB) and the center-low significant bit (CLSB) to be programmed to the word-line; and
programming, by the non-volatile flash memory device, each memory cell of the word-line according to the determined target voltage states.

4. The method of claim 1, wherein the at least one other significant bit is a center significant bit (CSB), wherein the at least one other significant bit page buffer is a CSB page buffer, and wherein the read of the word-line further comprises:
reading out, by the non-volatile flash memory device, the voltage states such that the center significant bit (CSB) portion of the voltage state is written to the CSB page buffer.

5. The method of claim 1, wherein the at least one other significant bit is a center-high significant bit (CHSB) and a center-low significant bit (CLSB), wherein the at least one other significant bit page buffer is a CHSB page buffer and a CLSB page buffer, and wherein the read of the word-line further comprises:
reading out, by the non-volatile flash memory device, the voltage states such that the center-high significant bit (CHSB) portion of the voltage state is written to the CHSB page buffer and the center-low significant bit (CLSB) portion of the voltage state is written to the CLSB page buffer.

6. The method of claim 1, wherein the at least one other significant bit page is a center significant bit (CSB) page.

7. The method of claim 1, wherein the at least one other significant bit page is a center-high significant bit (CHSB) page and a center-low significant bit (CLSB) page.

8. A computer program product comprising a non-transitory computer readable storage medium having a computer readable program stored therein, wherein the computer readable program, when executed by a non-volatile flash memory device, causes the non-volatile flash memory device to:
receive a single combined memory command for accessing a non-volatile flash memory, wherein each cell of the non-volatile flash memory physically stores three or more bits per cell and has at least eight possible threshold voltage distribution states;
decode a row address and a column address for a word-line to be accessed by the single combined memory command; and
access the word-line such that at least a most significant bit (MSB) page, a least significant bit (LSB) page, and at least one other significant bit page are accessed simultaneously, wherein the access to the word-line is selected from the group consisting of a programming of the word-line and a read of the word-line, wherein the computer readable program to program the word-line causes the non-volatile flash memory device to determine a target voltage state for each memory cell of the word-line by accessing at least MSB data, LSB data, and at least one other significant bit of data that is to be programmed to the word-line; and program each memory cell of the word-line according to the determined target voltage states, wherein the computer readable program to read the word-line causes the non-volatile flash memory device to determine a voltage state of each memory cell of the word-line; and read out the voltage states such that at least the MSB portion of the voltage state is written to an MSB page buffer, the LSB portion of the voltage state is written to an LSB page buffer, and the at least one other significant bit portion of the voltage state is written to at least one other significant bit page buffer, and wherein the access to the word-line is selected from the group consisting of:
a full-page access to the MSB page, a half-page access to the LSB page, and full-page access to the at least one other significant bit page;
a full-page access to the MSB page, a full-page access to the LSB page, and half-page access to the at least one other significant bit page;
a full-page access to the MSB page, a half-page access to the LSB page, and half-page access to the at least one other significant bit page;
a half-page access the MSB page, a full-page access to the LSB page, and full-page access to the at least one other significant bit page;
a half-page access to the MSB page, a half-page access to the LSB page, and full-page access to the at least one other significant bit page; and
a half-page access to the MSB page, full-page access to the LSB page, and half-page access to the at least one other significant bit page.

9. The computer program product of claim 8, wherein the at least one other significant bit is a center significant bit (CSB) and wherein the computer readable program to program the word-line further causes the non-volatile flash memory device to:
determine a target voltage state for each memory cell of the word-line by further accessing the center significant bit (CSB) to be programmed to the word-line; and
program each memory cell of the word-line according to the determined target voltage states.

10. The computer program product of claim 8, wherein the at least one other significant bit is a center-high significant bit (CHSB) and a center-low significant bit (CLSB) and wherein the computer readable program to program the word-line further causes the non-volatile flash memory device to:
determine a target voltage state for each memory cell of the word-line by further accessing the center-high significant bit (CHSB) and the center-low significant bit (CLSB) to be programmed to the word-line; and
program each memory cell of the word-line according to the determined target voltage states.

11. The computer program product of claim 8, wherein the at least one other significant bit is a center significant bit (CSB), wherein the at least one other significant bit page buffer is a CSB page buffer, and wherein the computer readable program to read the word-line further causes the non-volatile flash memory device to:

read out the voltage states such that the center significant bit (CSB) portion of the voltage state is written to the CSB page buffer.

12. The computer program product of claim 8, wherein the at least one other significant bit is a center-high significant bit (CHSB) and a center-low significant bit (CLSB), wherein the at least one other significant bit page buffer is a CHSB page buffer and a CLSB page buffer, and wherein the computer readable program to read the word-line further causes the non-volatile flash memory device to:

read out the voltage states such that the center-high significant bit (CHSB) portion of the voltage state is written to the CHSB page buffer and the center-low significant bit (CLSB) portion of the voltage state is written to the CLSB page buffer.

13. An apparatus comprising:

a non-volatile flash memory; and a memory controller coupled to the non-volatile flash memory, wherein the memory controller and the non-volatile flash memory comprise logic configured to:

receive a single combined memory command for accessing the non-volatile flash memory, wherein each cell of the non-volatile flash memory physically stores three or more bits per cell and has at least eight possible threshold voltage distribution states;

decode a row address and a column address for a word-line to be accessed by the single combined memory command; and access the word-line such that at least a most significant bit (MSB) page, a least significant bit (LSB) page, and at least one other significant bit page are accessed simultaneously, wherein the access to the word-line is selected from the group consisting of a programming of the word-line and a read of the word-line, wherein the logic configured to program the word-line causes the memory controller and the non-volatile flash memory to determine a target voltage state for each memory cell of the word-line by accessing at least MSB data, LSB data, and at least one other significant bit of data that is to be programmed to the word-line; and program each memory cell of the word-line according to the determined target voltage states, wherein the logic configured to read the word-line causes the memory controller and the non-volatile flash memory to determine a voltage state of each memory cell of the word-line; and read out the voltage states such that at least the MSB portion of the voltage state is written to an MSB page buffer, the LSB portion of the voltage state is written to an LSB page buffer, arid the at least one other significant bit portion of the voltage state is written to at least one other significant bit page buffer, and wherein the access to the word-line is selected from the group consisting of:

a full-page access to the MSB page, a half-page access to the LSB page, and full-page access to the at least one other significant bit page;

a full-page access to the MSB page, a full-page access to the LSB page, and half-page access to the at least one other significant bit page;

a full-page access to the MSB page, a half-page access to the LSB page, and half-page access to the at least one other significant bit page;

a half-page access to the MSB page, a full-page access to the LSB page, and full-page access to the at least one other significant bit page;

a half-page access to the MSB page, a half-page access to the LSB page, and full-page access to the at least one other significant bit page; and a half-page access to the MSB page, a full-page access to the LSB page, and half-page access to the at least one other significant bit page.

14. The apparatus of claim 13, wherein the at least one other significant bit is a center significant bit (CSB) and wherein the logic configured to program the word-line further causes the memory controller and the non-volatile flash memory device to:

determine a target voltage state for each memory cell of the word-line by further accessing the center significant bit (CSB) to be programmed to the word-line; and program each memory cell of the word-line according to the determined target voltage states.

15. The apparatus of claim 13, wherein the at least one other significant bit is a center-high significant bit (CHSB) and a center-low significant bit (CLSB) and wherein the logic configured to program the word-line further causes the memory controller and the non-volatile flash memory device to:

determine a target voltage state for each memory cell of the word-line by further accessing the center-high significant bit (CHSB) and the center-low significant bit (CLSB) to be programmed to the word-line; and program each memory cell of the word-line according to the determined target voltage states.

16. The apparatus of claim 13, wherein the at least one other significant hit is a center significant bit (CSB), wherein the at least one other significant bit page buffer is a CSB page buffer, and wherein the logic configured to read the word-line further causes the memory controller and the non-volatile flash memory device to:

read out the voltage states such that the center significant bit (CSB) portion of the voltage state is written to the CSB page buffer.

17. The apparatus of claim 13, wherein the at least one other significant bit is a center-high significant bit (CHSB) and a center-low significant bit (CLSB), wherein the at least one other significant bit page buffer is a CHSB page buffer and a CLSB page buffer, and wherein the logic configured to read the word-line further causes the memory controller and the non-volatile flash memory device to:

read out the voltage states such that the center-high significant bit (CHSB) portion of the voltage state is written to the CHSB page buffer and the center-low significant bit (CLSB) portion of the voltage state is written to the CLSB page buffer.

* * * * *